United States Patent [19]

Talisa et al.

[11] Patent Number: 5,693,595
[45] Date of Patent: Dec. 2, 1997

[54] INTEGRATED THIN-FILM TERMINATIONS FOR HIGH TEMPERATURE SUPERCONDUCTING MICROWAVE COMPONENTS

[75] Inventors: Salvador H. Talisa, Edgewood; Daniel L. Meier, Forest Hills, both of Pa.

[73] Assignee: Northrop Grumman Corporation, Los Angeles, Calif.

[21] Appl. No.: 471,063

[22] Filed: Jun. 6, 1995

[51] Int. Cl.$^6$ .......................... H01L 39/00; H01B 12/00; H01F 6/00; H01P 1/00
[52] U.S. Cl. .......... 505/210; 505/220; 257/662; 257/275; 257/277; 257/516; 257/532; 257/533; 257/536; 333/12; 333/995; 361/738; 361/766; 327/554
[58] Field of Search ................... 257/661, 662, 257/663, 275, 274, 277, 533, 516, 532, 536; 505/191, 210, 220, 856, 866; 333/99.5, 12; 361/738, 766; 327/554

[56] References Cited

U.S. PATENT DOCUMENTS

| | | | |
|---|---|---|---|
| 4,837,609 | 6/1989 | Gurvitch et al. | 257/663 |
| 4,876,176 | 10/1989 | Calviello et al. | 257/533 |
| 5,021,867 | 6/1991 | Przybysz | 257/662 |
| 5,219,827 | 6/1993 | Higaki et al. | 333/995 |
| 5,455,064 | 10/1995 | Chou et al. | 427/79 |
| 5,488,253 | 1/1996 | Matsuoka | 257/622 |

FOREIGN PATENT DOCUMENTS

| | | | |
|---|---|---|---|
| 4-125958 | 4/1992 | Japan | 257/532 |

OTHER PUBLICATIONS

"HTS Filters and Delay Lines Suit EW Systems", by Joe Madden and Neal Fenzi, Microwaves & RF, May, 1994, pp. 79 and 84.

"High–$T_c$ Materials Expand Superconductive Circuit Applications", by A. Davidson, J. Talvacchio, M.G. Forrester and J.R. Gavaler, Microwaves & RF, Apr., 1994, pp. 140–146.

Primary Examiner—Mahshid D. Saadat
Assistant Examiner—Alice W. Tang
Attorney, Agent, or Firm—Walter G. Sutcliff

[57] ABSTRACT

A termination for a high-temperature superconductive thin-film microwave device formed on the obverse side of a substrate with the reverse side of the substrate having a ground plane. The termination can include a thin-film resistor being integral with an operative component, with the substrate being a preselected dielectric substrate. The resistor can have an epitaxially-formed layer of molybdenum metal of a first preselected thickness on the obverse side, and an epitaxially-formed layer of titanium metal of a second preselected thickness thereon. The termination includes a epitaxially-formed thin-film capacitor integral with the resistor. The capacitor can have a layer of titanium metal formed on a portion of the obverse side with a layer of gold metal formed thereon. The substrate can be lanthanum aluminate, and the high-temperature superconductive film can be a yttrium-barium-copper-oxide film. The ground plane can be made of a high-temperature superconductive film and annealed gold.

27 Claims, 2 Drawing Sheets

INTEGRATED THIN-FILM TERMINATIONS FOR HIGH TEMPERATURE SUPERCONDUCTING MICROWAVE COMPONENTS

BACKGROUND OF THE INVENTION

1. Field of the Invention

This invention relates to high-temperature superconductive epitaxially-grown thin-film devices and, in particular, integrated microwave load terminations for high-temperature, superconductive epitaxially-grown thin-film devices.

2. Description of the Prior Art

High-temperature superconductive (HTS) epitaxial thin-films offer the possibility for high-performance components which cannot be made in conventional planar technology because of high loss. Generally, in order to reduce losses, the components can be made of a single-crystal dielectric material substrate, such as, for example, lanthanum aluminate ($LaAlO_3$) or LAO, whose surfaces are deposited with a single-crystal HTS film, such as, for example, a layered copper-oxide compound like yttrium-barium-copper-oxide (YBCO). Such HTS films can have a critical temperature of at least 90° K., the temperature below which the inherent resistance approaches zero.

Some of the applications for HTS thin-film components have low insertion loss requirements that make the use of high-temperature superconductors an attractive alternative to much bulkier conventional technology. This is particularly so whenever many narrow bandwidth frequency channels are needed. Such high-performance components can include microwave filter banks which are of interest in applications such as radar, electronic warfare, and communications systems. Electronic warfare channelized receivers, for example, require high-performance intermediate frequency (IF) filterbanks with many channels, e.g. 20 to 40, typically, as well as a low-loss front-end switched filterbank. Some high performance component architectures require lumped-element devices such as circuit terminations in order to work properly. Such termination devices can be used as loads on certain devices, for example, hybrid couplers. The function of the load is to absorb any residual energy transmitted to the load by the rest of the circuit. At present, in conventional planar microwave technology, terminations can be made by mounting a ceramic resistor that matches the characteristic impedance of the line to be terminated. This requires via holes in the substrate to make connections to ground from the circuits. Creation of via holes, however, risks damage to the substrate and generally increases the complexity of the fabrication process. In addition, mounting ceramic resistors can be costly and inherently unreliable. What is needed then is an integrated thin-film termination for high-temperature superconducting microwave components that does not require the creation of via holes and is relatively simple to fabricate.

SUMMARY OF THE INVENTION

The invention herein provides a termination for a high-temperature superconductive thin-film microwave device formed on the obverse side of a substrate with the reverse side of the substrate having a ground plane. The termination can include a thin-film resistor being integral with, and operably connected to, an operative component, with the substrate being a preselected dielectric substrate. The resistor can have a layer of molybdenum metal which is epitaxially formed to a first preselected thickness on the obverse side. Alternatively, metals such as nickel-chromium alloy, vanadium, tantalum, niobium, and the like, may be used to provide a resistivity generally comparable to that of molybdenum at 77° K. The resistor also can have a layer of titanium metal, which can be epitaxially formed to a second preselected thickness on at least a portion of the layer of molybdenum metal. Alternatively, metals such as chromium or aluminum may be used to cap the first metal layer.

The termination also includes a thin-film capacitor electrically connected to and integral with the resistor. The capacitor can be epitaxially formed on the substrate, with the top of the capacitor being formed on the obverse side of the substrate, and the bottom part being the ground plane. The capacitor can have a layer of titanium metal formed on a predefined portion of the obverse side, and a layer of gold metal formed on at least a portion of the layer of titanium metal. The substrate can be lanthanum aluminate, and the high temperature superconductive film can be a yttrium-barium-copper-oxide film.

The ground plane can be made of a high-temperature superconductive film and annealed gold. In the alternative, the ground plane can be made of a layer of titanium metal being epitaxially formed on said reverse side and having a first preselected thickness, a first layer of gold metal being epitaxially formed on at least a portion of said layer of titanium metal and having a second preselected thickness, and a second layer of gold metal having a third preselected thickness, with the second layer being formed on at least a portion of the first layer by an electrochemical process such as, for example, plating.

In the resistor, the first preselected thickness of the molybdenum can be between about 60 nm and about 100 nm, with a preferred thickness of about 80 nm; the second preselected thickness of the titanium can be between about 10 nm and about 200 nm, with a preferred thickness of about 10 nm. Where the alternative, layered ground plane structure is employed, the first preselected thickness of the titanium metal layer can be between about 10 nm and about 200 nm, with about 20 nm being preferred, the second preselected thickness of the first layer of gold metal is between about 100 nm and 500 nm, with about 200 nm being preferred, and the third preselected thickness of said second layer of gold can be between about 2 µm and about 4 µm, with about 2 µm being preferred.

DETAILED DESCRIPTION OF THE PREFERRED EMBODIMENTS

Figure 1A:
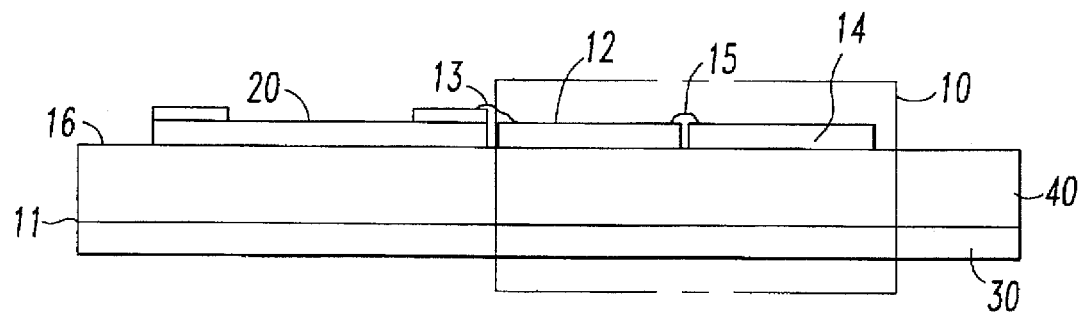
FIG. 1A is a sectional view of a HTS thin-film microwave device employing a termination according to the invention described herein.

The invention herein provides an apparatus and method for producing integrated thin-film terminations for high-temperature superconducting microwave components employing epitaxial thin film techniques. The invention herein includes an integrated thin-film termination suitable for operation at cryogenic temperatures, e.g., 77° K., and for integration with HTS planar microwave circuits.

HTS microwave components including integral epitaxially-grown, thin-film terminations can be fabricated by sputtering an epitaxial YBCO film on the obverse side of a LAO substrate wafer. Currently, the LAO substrate is available in two-inch-diameter (about 50 mm) wafers that are approximately 20 mils (about 0.5 mm) thick, although LAO substrates of different diameters and thicknesses can be used. The sputtered epitaxial YBCO film suitable for microwave applications can be from about 200 nm to about 800 nm thick, with a preferred thickness of about 400 nm to about 500 nm.

Contacts, which are preferred to be gold, can be deposited upon the YBCO thin film by lift-off pattern transfer using the image-reversal lithography process. Although the contacts can be between about 50 nm and about 400 nm thick, a thickness of about 200 nm is preferred. In lift-off, the pattern of the gold contact areas is formed by lithography on a masking layer which covers the entire substrate except for the said gold contact areas. The desired metal is then deposited on the masked substrate. Those portions of the film over the mask are removed by dissolving the masking layer in an appropriate liquid solvent such as, for example, acetone, so that the overlying film is lifted off and removed, revealing the desired pattern.

It is preferred that the gold contacts be annealed to achieve low contact resistivity between the gold and YBCO films. Annealing of the gold contacts to the YBCO film can be done in a quartz tube furnace by ramping the furnace temperature from room temperature to a preselected temperature between about 500° C. and about 600° C. with about 550° C. being preferred, in approximately 30 minutes, maintaining the furnace temperature at the preselected temperature, e.g., about 550° C., for approximately 30 minutes, and then cooling the furnace to room temperature over an extended period, for example, 12 hours, by turning the furnace off. It is preferred that oxygen be flowing through the furnace at a rate of 1000 sccm during the entire heating and cooling time.

A YBCO ground plane can be deposited on the reverse side of the substrate in the same way as that on the obverse side. A contact gold layer then can be deposited on top of the YBCO ground plane and then annealed as described before. This contact gold layer can cover the entire ground plane; its function is to provide a low resistance contact to the ground return currents in the metallic package onto which the HTS device is mounted.

Alternatively, for those devices that do not require the minimum loss attainable, a titanium-gold ground plane base can be deposited upon the reverse side of the LAO substrate wafer using conventional sputtering techniques. A layer of titanium first can be deposited, with a preferred thickness of about 20 nm. Deposited upon the titanium layer is a gold metal layer with a preferred thickness greater than 200 nm. The titanium deposited during the ground plane base deposition promotes adherence between Au and LAO, and the gold assists the deposition of the ground plane thick metal layer by a further electrochemical process to a thickness of about 2 µm to about 4 µm.

Once the ground plane has been established, the predetermined HTS microwave device can be patterned by etching the YBCO device pattern on the obverse side of the wafer using a plasma-assisted etching technique such as, for example, ion beam milling, in order to obtain the desired device characteristics. The YBCO film is completely removed by ion-beam milling except in the patterned device areas.

With the HTS microwave device being defined, at least one integrated thin film termination according to the invention herein can be applied. To define the resistor of the termination, a molybdenum-titanium (Mo/Ti) strip can be deposited on the LAO substrate. Using lift-off pattern transfer techniques, a layer of molybdenum having a thickness of between about 60 nm to about 100 nm, with a preferred thickness of about 80 nm can be deposited on the LAO substrate. Although a layer of molybdenum metal is preferred, certain refractory metals possessing resistivity comparable to molybdenum at 77° K. may be used. Generally, such metals can include vanadium, tantalum, niobium, and the like; nickel-chromium alloys may also be used.

After deposition, the molybdenum strip can be capped with a layer of titanium, also using lift-off pattern transfer techniques. The titanium layer can be between about 10 nm to about 200 nm, with a preferred thickness being about 10 nm. Alternatively, capping can employ chromium and aluminum metals. It is preferred that the chromium layer be between about 10 nm and about 20 nm thick. Similarly, it is preferred that the aluminum layer be between about 10 nm and about 20 nm thick. The titanium layer is intended to protect the molybdenum from oxidation under ambient conditions.

The geometry of the resistor can be adjusted to provide a sheet resistance at 77° K. of approximately 1.0 ohms/square. Although it is preferred that the resistor have a value of approximately 50 ohms for certain applications, the geometry of the resistor can be varied to produce a preselected resistance value, with a wider resistor strip generally producing a lower resistance. Concomitant with the production of a resistance value is the generation of a parasitic inductance in the resistor. To counteract this inductance over a predefined frequency range, for example, the RF range, it is desired to provide a capacitor between the resistor and ground. A structure serving as both a capacitor and a contact pad can be fashioned from titanium and gold, which metals may be deposited upon the substrate using the aforementioned lift-off pattern transfer techniques. Using the lift-off techniques, a layer of titanium between about 10 nm to about 200 nm with a preferred thickness of approximately 20 nm is deposited on the LAO substrate. Thereafter, a layer of gold having a thickness of between about 100 nm to about 500 nm, with a preferred thickness of about 200 nm, is deposited thereon.

FIG. 1A illustrates a section view termination 10 according to the invention herein, having an integrated thin-film resistor 12 and thin-film capacitor 14. For this example, the termination 10 is connected to a YBCO microstrip circuit 20. Termination 10 can have a Mo-Ti resistor 12, and a Ti-Au capacitor and contact pad 14, both resistor and pad 14 being deposited on obverse side 16 of LAO substrate 40. Ground plane 30 can be formed on reverse side 11 of substrate 40, as described above. The resistor 12 can be a length of narrow stripline, which provides the preselected resistance per unit length as well as a parasitic inductance. Capacitor 14 can be a generally square gold pad which provides a shunt capacitance to ground plane 30 using LAO substrate 40 as the capacitor dielectric. Resistor 12 can be electrically connected to circuit 20 using a suitable contact such as, for example, titanium-gold contact 13. Likewise, capacitor 14 can be electrically connected to resistor 12 by a suitable contact such as, for example, titanium-gold contact 15. The return losses obtained from termination 10 according to the invention herein generally can be maintained within the range of between about 8 dB and 26 dB for a frequency range between about 2 GHz and about 6 GHz at 77° K. In contrast, return losses obtained from commercial, coaxial 50 ohm terminations typically are on the order of 30 dB or greater.

Figure 1B:
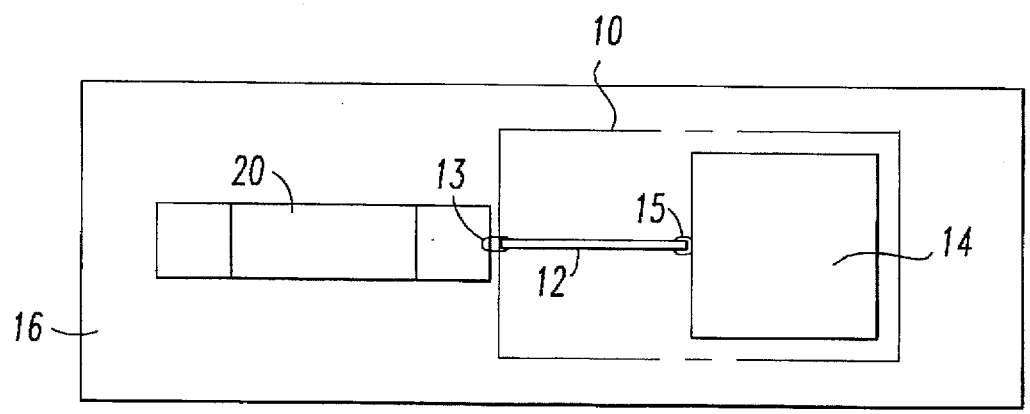
FIG. 1B is a top view of the entities illustrated in FIG. 1A.

FIG. 1B is a top view of termination 10 seen in FIG. 1A showing the general layout of resistor 12 and capacitor 14 on LAO substrate 40 with respect to YBCO microstrip circuit 20. Obverse side 16, contacts 13 and 15 are also shown; however, ground plane 30 cannot be seen from this vantage.

Figure 2:
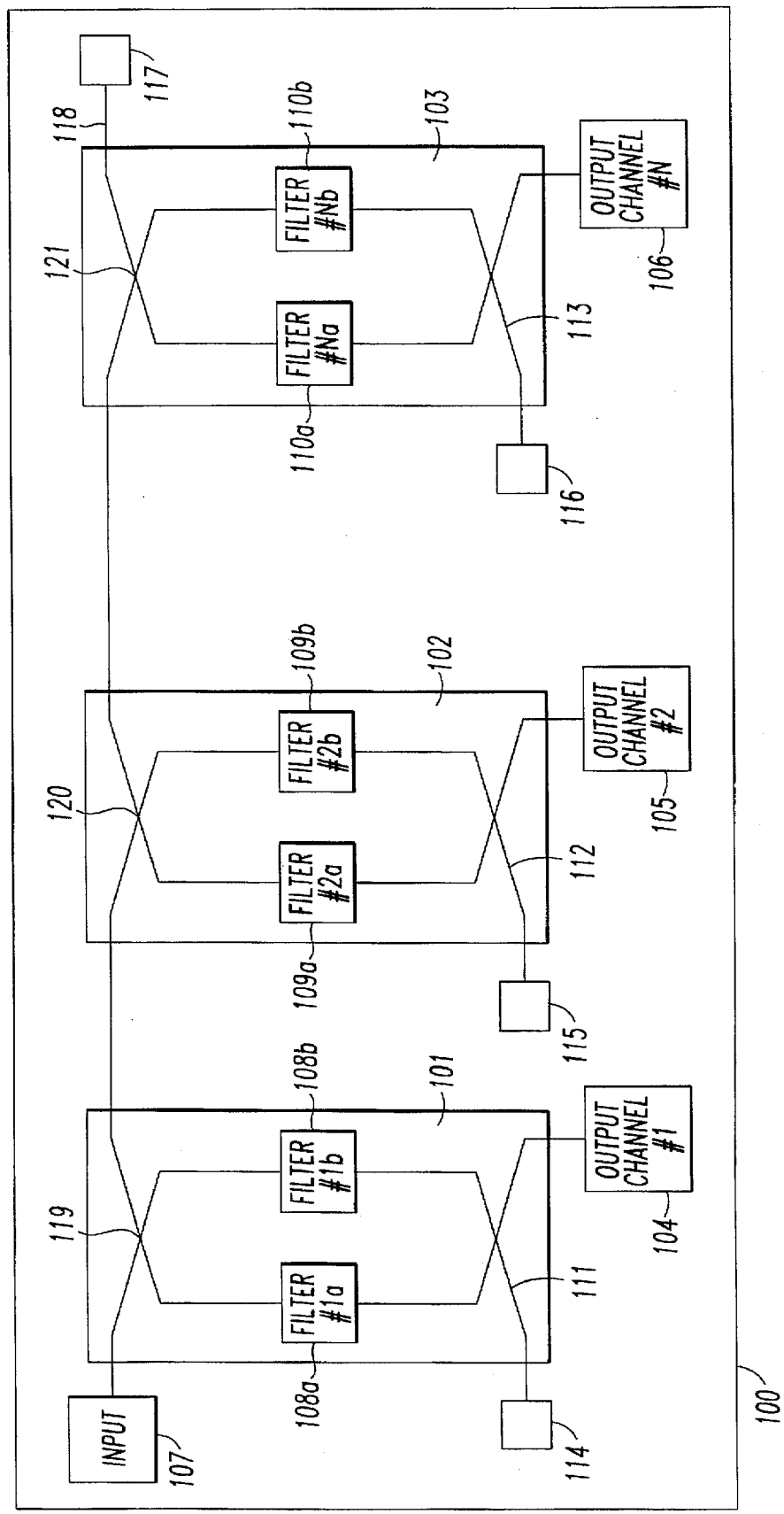
FIG. 2 is a diagram of a HTS thin-film filterbank employing terminations according to the invention described herein.

FIG. 2 shows the integrated thin-film termination according to the invention herein being used in an HTS device such as, for example, microwave filterbank 100. Filterbank 100 can include a plurality of filter sections 101, 102, 103, each of which accepting an input signal from a common input 107 by way of respective 90° hybrid couplers 119, 120, 121, and supplying filtered output signals to respective output channels 104, 105, 106. The termination can also be used with other HTS epitaxial thin-film microwave devices such as, for example, delay lines and switched filterbanks. Each filter section 101, 102, 103 can include a respective pair of matched filters 108a, 108b, 109a, 109b, 110a, 110b such as those defined by a quarter-wavelength parallel-coupled section microstrip topology. To each of the out-of-phase ports 111, 112, 113 on the respective filter sections 101, 102, 103 is connected a thin-film load termination 114, 115, 116. Termination 117 terminates transmission line 118 from hybrid coupler 121.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the invention which is to be given the full breadth of the following claims and any and all embodiments thereof.

We claim:

1. An integrated circuit termination for a thin-film microwave device having a characteristic impedance and being formed on a substrate wherein the substrate has an obverse side and a reverse side opposite to said obverse side, and wherein the substrate has a ground plane provided on said reverse side, and wherein said device has at least one operative component, said termination comprising:

(a) a thin-film resistor, being formed on said obverse side of said substrate, said thin-film resistor being operably connected to said at least one operative component, said substrate being a preselected dielectric substrate suitable for use with a high-temperature superconductive film, said thin-film resistor having an associated parasitic inductance;

(b) a thin-film capacitor formed on and incorporating said substrate, said capacitor having a top part, a bottom part and a dielectric, said top part being formed on said obverse side, said bottom part being said ground plane, said capacitor being electrically connected to said resistor, said capacitor dielectric being said substrate;

(c) said thin-film resistor being of predetermined dimensions that said associated parasitic inductance and said thin-film capacitor form an essentially resonant circuit over a predetermined frequency range to provide a path to ground for said thin-film resistor such that the value of resistance of said thin-film resistor substantially matches the characteristic impedance of said microwave device to be terminated by said termination;

(d) said substrate being completely devoid of via holes connecting said ground plane with said thin-film resistor or capacitor.

2. The termination of claim 1 wherein said capacitor top part comprises a layer of titanium metal formed on a predefined portion of said obverse side, and a layer of gold metal formed on at least a portion of said layer of titanium metal.

3. The termination of claim 1 wherein said dielectric substrate is lanthanum aluminate.

4. The termination of claim 1 wherein said ground plane is comprised of a layer of a high-temperature superconductive film and a layer of annealed gold formed upon the layer of high temperature superconductive film.

5. The termination of claim 1 wherein said thin-film resistor is a metal selected from the group consisting of molybdenum, vanadium, tantalum, niobium, nickel-chromium alloy, and combinations thereof.

6. The termination of claim 1 wherein said thin-film resistor comprises a layer of a first preselected metal and a layer of a second preselected metal epitaxially formed on at least a portion of said layer of first preselected metal.

7. The termination of claim 6 wherein said second preselected metal is from the group consisting of titanium, chromium, aluminum, and combinations thereof.

8. The termination of claim 6 wherein said ground plane is comprised of:

(a) a layer of titanium metal having a first preselected thickness, said layer of titanium metal being epitaxially formed on said reverse side;

(b) a first layer of gold metal having a second preselected thickness, said first layer of gold metal being epitaxially formed on at least a portion of said layer of titanium metal; and (c) a second layer of gold metal having a third preselected thickness, said second layer being formed on at least a portion of said first layer by an electrochemical process.

9. The termination of claim 1 wherein said ground plane is comprised of:

(a) a layer of titanium metal having a first preselected thickness, said layer of titanium metal being epitaxially formed on said reverse side;

(b) a first layer of gold metal having a second preselected thickness, said first layer of gold metal being epitaxially formed on at least a portion of said layer of titanium metal; and (c) a second layer of gold metal having a third preselected thickness, said second layer being formed on at least a portion of said first layer by an electrochemical process.

10. The termination of claim 9 wherein aid first preselected thickness of said layer of titanium metal is between about 10 nm and about 200 nm and said second preselected thickness of said first layer of gold metal is between about 100 nm and about 500 nm and said third preselected thickness of said second layer of gold is between about 2 µm and about 4 µm.

11. The termination of claim 10 wherein said first preselected thickness is about 20 nm, said second preselected thickness is about 200 nm, and said third preselected thickness is about 2 µm.

12. The termination of claim 1 wherein said thin-film resistor comprises a layer of molybdenum metal having a first preselected thickness.

13. The termination of claim 12 wherein said first preselected thickness is between about 60 nm and about 100 nm.

14. The termination of claim 13 wherein said first preselected thickness is about 80 nm.

15. The termination of claim 12 wherein said thin-film resistor further comprises a layer of titanium metal having a second preselected thickness, said layer of titanium being epitaxially formed on at least a portion of said layer of molybdenum metal.

16. The termination of claim 15 wherein said second preselected thickness is between about 10 nm and about 200 nm.

17. The termination of claim 16 wherein said second preselected thickness is about 10 nm.

18. An integrated circuit termination for a thin-film microwave device having a characteristic impedance and being formed on a substrate wherein the substrate has an obverse side and a reverse side opposite to said obverse side, and wherein the substrate has a ground plane provided on said reverse side, and wherein said device has at least one operative component, said termination comprising:

(a) a thin-film resistor being operably connected to said at least one operative component, said substrate being a preselected dielectric substrate suitable for use with a high-temperature superconductive film, said resistor having a layer of molybdenum metal, said layer of molybdenum metal being formed to a first preselected thickness on said obverse side, said resistor having a layer of titanium metal, said layer of titanium metal being formed to a second preselected thickness on at least a portion of said layer of molybdenum metal, said thin-film resistor having an associated parasitic inductance;

(b) a thin-film capacitor formed on and incorporating said substrate, said capacitor having a top part, a bottom part and a dielectric, said top part being formed on said obverse side, said bottom part being said ground plane, said capacitor top part comprising a layer of titanium metal formed on a predefined portion of said obverse side, and a layer of gold metal formed on at least a portion of said layer of titanium metal, said capacitor being electrically connected to said resistor, said capacitor dielectric being said substrate;

(c) said thin-film resistor being of predetermined dimensions that said associated parasitic inductance and said thin-film capacitor form an essentially resonant circuit over a predetermined frequency range to provide a path to ground for said thin-film resistor such that the value of resistance of said thin-film resistor substantially matches the characteristic impedance of said microwave device to be terminated by said termination;

(d) said substrate being completely devoid of via holes connecting said ground plane with said thin-film resistor or capacitor.

19. The termination of claim 18 wherein said dielectric substrate is lanthanum aluminate.

20. The termination of claim 18 wherein said ground plane is comprised of a layer of a high-temperature superconductive film and annealed a layer of gold formed upon the layer of high temperature superconductive film.

21. The termination of claim 18 wherein said first preselected thickness is between about 60 nm and about 100 nm.

22. The termination of claim 21 wherein said first preselected thickness is about 80 nm.

23. The termination of claim 18 wherein said second preselected thickness is between about 10 nm and about 200 nm.

24. The termination of claim 23 wherein said second preselected thickness is about 10 nm.

25. The termination of claim 18 wherein said ground plane is comprised of:

(a) a layer of titanium metal having a third preselected thickness, said layer of titanium metal being epitaxially formed on said reverse side;

(b) a first layer of gold metal having a fourth preselected thickness, said first layer of gold metal being epitaxially formed on at least a portion of said layer of titanium metal; and (c) a second layer of gold metal having a fifth preselected thickness, said second layer being formed on at least a portion of said first layer by an electrochemical process.

26. The termination of claim 25 wherein aid first preselected thickness of said layer of titanium metal is between about 10 nm and about 200 nm and said second preselected thickness of said first layer of gold metal is between about 100 nm and 500 nm and said third preselected thickness of said second layer of gold is between about 2 μm and about 4 μm.

27. The termination of claim 25 wherein said first preselected thickness is about 20 nm, said second preselected thickness is about 200 nm, and said third preselected thickness is about 2 μm.

* * * * *